United States Patent
Wiedemuth (10) Patent No.: US 7,929,261 B2
(45) Date of Patent: Apr. 19, 2011

(54) SUPPRESSING ARC DISCHARGES (75) Inventor: Peter Wiedemuth, Herbolzheim (DE)

(73) Assignee: HUETTINGER Elektronik GmbH + Co. KG, Freiburg (DE)

( * ) Notice: Subject to any disclaimer, the term of this patent is extended or adjusted under 35 U.S.C. 154(b) by 553 days.

(21) Appl. No.: 12/044,338

(22) Filed: Mar. 7, 2008

(65) Prior Publication Data
US 2008/0218923 A1 Sep. 11, 2008

(30) Foreign Application Priority Data
Mar. 8, 2007 (EP) .................................. 07004758

(51) Int. Cl.
H02H 9/08 (2006.01)
C23C 14/32 (2006.01)

(52) U.S. Cl. ..................................... 361/42; 204/192.13
(58) Field of Classification Search ................... 361/42, 361/234; 204/192.13
See application file for complete search history.

(56) References Cited

U.S. PATENT DOCUMENTS

| | | |
|---|---|---|
| 4,031,464 A | 6/1977 | Norberg |
| 4,396,478 A | 8/1983 | Aizenshtein et al. |
| 4,588,952 A | 5/1986 | Matsuoka |
| 4,625,283 A | 11/1986 | Hurley |
| 4,694,402 A | 9/1987 | McEachern et al. |
| 4,936,960 A | 6/1990 | Siefkes et al. |
| 5,192,894 A | 3/1993 | Teschner |
| 5,241,152 A | 8/1993 | Anderson et al. |
| 5,543,689 A | 8/1996 | Ohta et al. |
| 5,576,939 A | 11/1996 | Drummond |
| 5,611,899 A | 3/1997 | Maass |
| 5,698,082 A | 12/1997 | Teschner et al. |
| 5,718,813 A | 2/1998 | Drummond et al. |
| 5,729,145 A | 3/1998 | Blades |
| 5,804,975 A | 9/1998 | Alers et al. |
| 5,889,391 A | 3/1999 | Coleman |
| 5,993,615 A | 11/1999 | Abry et al. |
| 6,007,879 A | 12/1999 | Scholl |
| 6,063,245 A | 5/2000 | Frach et al. |
| 6,162,332 A | 12/2000 | Chiu |
| 6,213,050 B1 | 4/2001 | Liu et al. |
| 6,332,961 B1 | 12/2001 | Johnson et al. |

(Continued)

FOREIGN PATENT DOCUMENTS
DE  4127504  2/1993
(Continued)

OTHER PUBLICATIONS

Translation of Office Action from correspondence Japanese Application No. 2007-504279, dated Sep. 28, 2009, 4 pages.

(Continued)

Primary Examiner — Ronald W Leja
(74) Attorney, Agent, or Firm — Fish & Richardson P.C.

(57) ABSTRACT

For suppressing arc discharges in a plasma process, a method includes monitoring of at least one parameter of the plasma process, determining a temporal feature of a first countermeasure and performing the first countermeasure. The temporal feature is determined as a function of, for example, at least one of an interval in time from at least one previous countermeasure, a development of the at least one parameter since a relevant time of introduction of the countermeasure, or since a variable period of time ahead of the relevant time of introduction of the countermeasure, and a differentiation as to whether a previous countermeasure was triggered based on the behavior of the at least one parameter, or based on the interval in time from at least one previous countermeasure.

23 Claims, 3 Drawing Sheets

U.S. PATENT DOCUMENTS

| | | |
|---|---|---|
| 6,416,638 B1 | 7/2002 | Kuriyama et al. |
| 6,420,863 B1 | 7/2002 | Milde et al. |
| 6,472,822 B1 | 10/2002 | Chen et al. |
| 6,535,785 B2 | 3/2003 | Johnson et al. |
| 6,545,420 B1 | 4/2003 | Collins et al. |
| 6,621,674 B1 | 9/2003 | Zahringer et al. |
| 6,736,944 B2 | 5/2004 | Buda |
| 6,740,207 B2 | 5/2004 | Kloeppel et al. |
| 6,753,499 B1 | 6/2004 | Yasaka et al. |
| 6,783,795 B2 | 8/2004 | Inoue et al. |
| 6,859,042 B2 | 2/2005 | Parker |
| 6,878,248 B2 | 4/2005 | Signer et al. |
| 6,943,317 B1 | 9/2005 | Ilic et al. |
| 6,967,305 B2 | 11/2005 | Sellers |
| 7,016,172 B2 | 3/2006 | Escoda |
| 7,081,598 B2 | 7/2006 | Ilic et al. |
| 7,262,606 B2 | 8/2007 | Axenbeck et al. |
| 7,301,286 B2 | 11/2007 | Kuriyama |
| 7,408,750 B2 | 8/2008 | Pellon et al. |
| 2004/0031699 A1 | 2/2004 | Shoji |
| 2004/0182697 A1 | 9/2004 | Buda |
| 2004/0212312 A1 | 10/2004 | Chistyakov |
| 2005/0051270 A1 | 3/2005 | Sasaki et al. |
| 2005/0093459 A1 | 5/2005 | Kishinevsky |
| 2005/0135025 A1 | 6/2005 | Escoda |
| 2006/0011473 A1 | 1/2006 | Kuriyama et al. |
| 2006/0054601 A1 | 3/2006 | Ilic et al. |
| 2006/0100824 A1 | 5/2006 | Moriya |
| 2006/0181816 A1 | 8/2006 | Pellon et al. |
| 2006/0213761 A1 | 9/2006 | Axenbeck et al. |
| 2007/0073498 A1 | 3/2007 | Winterhalter et al. |
| 2007/0121267 A1 | 5/2007 | Kotani et al. |
| 2007/0168143 A1 | 7/2007 | Axenbeck et al. |
| 2007/0251813 A1 | 11/2007 | Ilic et al. |
| 2008/0121517 A1 | 5/2008 | Nitschke |
| 2008/0121625 A1 | 5/2008 | Zaehringer |
| 2008/0122369 A1 | 5/2008 | Nitschke |
| 2008/0133154 A1 | 6/2008 | Krauss |
| 2008/0216745 A1 | 9/2008 | Wiedemuth et al. |
| 2008/0257869 A1 | 10/2008 | Nitschke et al. |

FOREIGN PATENT DOCUMENTS

| | | |
|---|---|---|
| DE | 43 26 100 | 2/1995 |
| DE | 44 20 951 | 12/1995 |
| DE | 19651615 | 7/1997 |
| DE | 19849636 | 5/2000 |
| DE | 10034895 | 2/2002 |
| DE | 10119058 | 10/2002 |
| DE | 102004015090 | 11/2005 |
| DE | 102006002333 | 7/2007 |
| EP | 0713242 | 5/1996 |
| EP | 0 967 697 | 12/1999 |
| EP | 0 692 138 | 1/2004 |
| EP | 1 441 576 | 7/2004 |
| EP | 1705687 | 9/2006 |
| EP | 1720195 | 11/2006 |
| JP | 06132095 | 5/1994 |
| JP | 08-167500 | 6/1996 |
| JP | 08222398 | 8/1996 |
| JP | 09170079 | 6/1997 |
| JP | 2000117146 | 4/2000 |
| JP | 2005077248 | 3/2005 |
| WO | WO 94/25977 | 11/1994 |
| WO | WO 01/13402 | 2/2001 |
| WO | WO 03/037047 | 5/2003 |
| WO | WO 03/088445 | 10/2003 |
| WO | WO 2006/014212 | 2/2006 |
| WO | WO2006116445 | 11/2006 |

OTHER PUBLICATIONS

Ochs et al., "Advanced Power Supplies designed for Plasma Deposition and Etching", Vakuum in Forschung und Praxis, vol. 8, No. 5, Sep. 26, 2006, pp. 32-36.

Van Zyl et al., "Managing Arcs in RF Powered Plasma Processes", Society of Vacuum Coaters, 48th Annual Technical Conference Proceedings, 2005, pp. 44-49.

Zlatanovic et al., "Glow-to-Arc Transition Instability Sensor in Processing Plasma", Proc. 20th International Conference on Microelectronics, vol. 2, Sep. 12-14, 1995, pp. 597-600.

European Search Report from corresponding European Application No. 07 004 758.4, mailed Jul. 12, 2007, 8 pages.

SUPPRESSING ARC DISCHARGES

CROSS REFERENCE TO RELATED APPLICATION

This application claims priority under 35 U.S.C. §119(a) from EP Application No. 07 004 758.4, filed Mar. 8, 2007, the entire contents of which are hereby incorporated by reference.

TECHNICAL FIELD

The invention relates to the suppression of arc discharges in the operation of a plasma process, and more particularly to a countermeasure for the suppression of arc discharges that interrupts or reverses a power supply to the plasma process in polarity as a function of at least one parameter.

BACKGROUND

Plasma can be used in coating, etching, or ashing processes. A very common plasma process is so-called sputtering, in which atoms are removed from a target by means of accelerated ions from the plasma. The atoms are then deposited on a substrate. Reactive gases are often added in the sputtering process, in order to deposit compounds such as, e.g. $Al_2O_3$, on the substrate. This type of sputtering is called reactive sputtering. In reactive sputtering insulating layers can also be formed on the target. Insulating layers of this kind can be charged by the ions that are accelerated onto the target. If the field strength of an insulating layer that has been charged in this manner exceeds the breakdown field strength, arc discharges (also called arcs) can be formed. Arc discharges can be short-lived and self-extinguishing (so-called short or micro arcs), or long-lived and highly energetic (so-called hard arcs). Short arcs for the most part only cause minor damage and can be allowed to occur for many processes, e.g. glass coating. Hard arcs can lead to the destruction of the target and to imperfections on the substrate. Appropriate countermeasures are therefore used to extinguish hard arcs.

To initiate the above cited measures, devices for the detection of arc discharges (arc detection) and also for the suppression or extinction of the arc discharges (arc suppression) are in many cases an integral part of a plasma power supply.

A reliable detection of arc discharges or arcs is important. At the output of the plasma power supply, an arc discharge can be detected by detecting a dip or a decrease in voltage, or an increase in current. In other words: by monitoring at least one appropriate parameter, e.g., an electrical parameter of the plasma process, arc discharge detection can be performed.

As above indicated, in the plasma process not only long-lived arc discharges (hard arcs) can occur, which under certain circumstances lead to a complete destruction of the substrate or the target, but also short or micro arcs (in the following summarized as short arcs) can occur. Short arcs are regularly less pronounced and self-extinguishing. However, it is also known that a short arc can grow into a hard arc if no appropriate countermeasure is executed.

SUMMARY

In one general aspect of the invention, a method for suppressing arc discharges in an operation of a plasma process includes monitoring of at least one parameter of the plasma process, determining a temporal feature of a first countermeasure as a function of at least one of the following parameters: an interval in time from at least one previous countermeasure, a development of the at least one parameter since a relevant time of introduction of the countermeasure, or since a variable period of time ahead of the relevant time of introduction of the countermeasure, and a differentiation as to whether a previous countermeasure was triggered based on the behavior of the at least one parameter, or based on the interval in time from at least one previous countermeasure. The method further includes performing the first countermeasure. The countermeasure counteracts and/or suppresses arc discharges that can develop during a plasma process.

In another aspect, an arc discharge detection device for a plasma process includes a monitoring unit, which is configured to monitor at least one parameter for the detection of an arc discharge in the plasma process with the aid of the at least one parameter, and to output a corresponding monitoring signal, a control unit, which is configured to receive the monitoring signal from the monitoring unit and to output a control signal to initiate a countermeasure for the suppression of the arc discharge, and a timer unit, which is configured to supply a time reference signal to the control unit, wherein the control unit is configured to determining a temporal feature of a first countermeasure as a function of at least one of the following parameters: an interval in time from at least one previous countermeasure, a development of the at least one parameter since a relevant time of introduction of the countermeasure, or since a variable period of time ahead of the relevant time of introduction of the countermeasure, and a differentiation as to whether a previous countermeasure was triggered based on the behavior of the at least one parameter, or based on the interval in time from at least one previous countermeasure.

In another aspect, a plasma power supply device includes a power source to supply power to the plasma process and an arc discharge detection device as described above, which is in a functional connection with the power source.

In another aspect, a method for adjusting the time period between pulses within a sequence of countermeasures for suppressing arc discharges in a plasma process includes performing the first countermeasure, determining a period of time until performing a subsequent countermeasure, monitoring of at least one parameter of the plasma process, performing the subsequent countermeasure after elapse of the period of time from the termination of the first countermeasure, wherein the period of time is determined based on at least one of the temporal development of the electrical parameter and a time interval between previous countermeasures.

Implementations may include one or more of the following features. In some embodiments, performing the first countermeasure can include at least one of interrupting a power supply to the plasma process and reversing a polarity of the power supply.

In some embodiments, the temporal feature can include at least one of a time of introduction of the first countermeasure and a first time interval corresponding to the duration of the first countermeasure.

In some embodiments, the method can further include detecting a first arc discharge, and the first countermeasure can be triggered immediately after detecting the first arc discharge. For example, the first countermeasure can be triggered within a few 100 nanoseconds after detecting the first arc discharge.

In some embodiments, the method can further include detecting a short arc discharge, and the first countermeasure can be executed during a first time interval. The first time interval can have a duration of, for example, 1 to 5 µs.

In some embodiments, the method can further include evaluating the temporal development of the electrical parameter to indicate a non self-extinguishing arc discharge, and extending a duration of the first countermeasure. Extending the duration of the first countermeasure can include activating a second time interval.

In some embodiments, the method can further include detecting a second arc discharge within a first prescribed period of time after termination of the first countermeasure, and extending a duration of a second time interval by an extension interval.

In some embodiments, the method can further include detecting no further arc discharge within a first prescribed period of time after termination of a countermeasure, and shortening a duration of a second time interval by a reduction interval. The shortening can be limited, for example, by a minimum value allowed for the second time interval.

In some embodiments, the method can further include determining a second period of time, and performing a subsequent countermeasure after elapse of the second period of time from the termination of the first countermeasure. The second period of time can be determined based, for example, on at least one of the temporal development of the electrical parameter and a time interval between countermeasures.

In some embodiments, the determination of the second period of time can be based on the equation $t(x)=[t(0)-t(-1)]\cdot k$, wherein $t(x)$ denotes a time of introduction of the subsequent countermeasure, $t(0)$ denotes a time of introduction of the first countermeasure, $t(-1)$ denotes a time of introduction of the previous countermeasure, and k denotes a numerical factor. Then, the method can include, for example, determining that the previous countermeasure has been triggered on the basis of detection of an arc discharge, and selecting the numerical factor k according to $k=k1$, $0.5 \leq k1 \leq 1$ to shorten the time interval to a succeeding countermeasure.

The method can also include determining that the previous countermeasure has been triggered independently of any detection of an arc discharge after elapse of a second period of time, and selecting the numerical factor k according to $k=k2$, $k2>1$ to lengthen the time interval to a succeeding countermeasure.

In some embodiments, the method can further include selecting time intervals between countermeasures within a series of countermeasures to be larger than a minimum time interval.

In some embodiments, the method can further include selecting time intervals between countermeasures within a series of countermeasures to be smaller than a maximum time interval.

In some embodiments of the method for adjusting the time period between pulses within a sequence of countermeasures for suppressing arc discharges in a plasma process, the determination of the period of time can be based on the equation $t(x)=[t(0)-t(-1)]\cdot k$, wherein $t(x)$ denotes a time of introduction of the subsequent countermeasure, $t(0)$ denotes a time of introduction of the first countermeasure, $t(-1)$ denotes a time of introduction of a previous countermeasure, and k denotes a numerical factor. For example, the method can then further include determining that the previous countermeasure has been triggered on the basis of the detection of an arc discharge, and selecting the numerical factor k according to $k=k1$, $0.5 \leq k1 \leq 1$ to shorten the time interval to a succeeding countermeasure. The method can further include determining that the previous countermeasure has been triggered independently of any detection of an arc discharge after elapse of a second period of time, and selecting the numerical factor k according to $k=k2$, $k2>1$ to lengthen the time interval to a succeeding countermeasure.

In some embodiments, the method can further include selecting time intervals between countermeasures within a series of countermeasures to be larger than a minimum time interval.

In some embodiments, the method can further include selecting time intervals between countermeasures within a series of countermeasures to be smaller than a maximum time interval.

In some embodiments, the method can further include determining that the previous countermeasure has been triggered on the basis of the detection of an arc discharge, and shortening the time interval to a succeeding countermeasure.

In some embodiments, the method can further include determining that the previous countermeasure has been triggered independently of any detection of an arc discharge after elapse of a second period of time, and lengthening the time interval to a succeeding countermeasure.

In another aspect, a method for the suppression of arc discharges in the operation of a plasma process, in which as a countermeasure for the suppression of arc discharges a power supply to the plasma process is interrupted or reversed in polarity as a function of at least one parameter, in that a time of introduction and/or a timewise behavior of the countermeasure is selectively determined as a function of at least one of the following parameters: an interval in time from at least one previous countermeasure, a behavior of the at least one parameter since a relevant time of introduction, or since a variable period of time before the relevant time of introduction, a differentiation as to whether a previous countermeasure was triggered due to the behavior of the at least one parameter, or due to the interval in time from at least one previous countermeasure.

In another aspect, an arc discharge detection device includes a monitoring unit that is designed to monitor at least one parameter for the detection of an arc discharge in the plasma process and to output a corresponding monitoring signal, a control unit that is designed to receive the monitoring signal from the monitoring unit and to output a control signal to effect a countermeasure for the suppression of the arc discharge, and a timer unit that is designed to supply a time reference signal to the control unit, wherein the control unit is adapted to implement a method in accordance with the preceding aspect.

In another aspect, a plasma power supply device includes a power source for a power supply to the plasma process that has an arc discharge detection device in a functional connection with the power source according to the previous aspect.

In some embodiments, the point in time of an anticipated forthcoming arc discharge can be therefore predetermined from the timewise behavior of a parameter, such as, for example, voltage or current, and also from the points in time of previous interruptions of the power supply, and upon reaching this point in time an appropriate interruption of the supplied power can be triggered in a pulse shaped manner, a single time or multiple times, if necessary with a reversal of the polarity of the output voltage of the voltage source to the plasma power supply. In general, this kind of operation of the plasma power supply is referred to herein as performing a pulse shaped interruption when supplying power to the plasma process.

In some embodiments, a pulse can be applied once or several times when an arc discharges has been detected. In other words: an arc discharge needs usually to be detected first, e.g., by means of the monitored parameter, before then subsequently at least one appropriate first countermeasure will be triggered. In some instances, additional countermeasures can follow the first countermeasure wherein the temporal sequence of the countermeasures, in particular the distance between pulses during the sequence, is selectively adjusted to the according arc(s). In the event of arc discharges frequently occurring in the plasma process, the sequence of countermeasures provided by the method can be almost periodic. However, no countermeasures and no pulse sequence will be initiated if no arc discharge occurs.

In some embodiments, the arc discharges can in principle be actively extinguished without delay, e.g., with the least delay time possible, which typically can be of the order of a few tens to one hundred nanoseconds, by interrupting the supplied power and possibly by the reversal of polarity of the output voltage. Here the duration of an appropriate arc discharge extinction pulse should typically not exceed 1 to 5 μs, so that the treatment rate of a plasma process is not, or only insignificantly, impaired.

From the behavior of the parameter, such as current or voltage, during the arc discharge extinction process and/or from the time that has elapsed since the occurrence of at least one previous arc discharge, it is determined in some embodiments whether a short arc or a hard arc is concerned. In some embodiments, if a hard arc is present the duration of the interruption of the supplied power can be appropriately extended in order to extinguish reliably an arc discharge of this kind.

An advantage of performing countermeasures that consider the history of events can be that a throughput of the plasma process, for example a deposition rate or the like, is kept as high as possible because the supply power is interrupted only as often as it is needed for the arc discharges that in fact occur in the plasma process.

Thus, some embodiments of the invention can help to reduce the adverse effects of arc discharges on the plasma process and to minimize or reduce the amount of equipment involved in the plasma process, thereby maintaining the throughput as high as possible.

The details of one or more embodiments of the invention are set forth in the accompanying drawings and the description below. Other features, objects, and advantages will be apparent from the description and drawings, and from the claims. The individual features of the dependent claims can each be implemented separately alone or in groups of one or more in arbitrary combinations in a variant of the invention.

DETAILED DESCRIPTION

The operation of a power supply device can be adapted to provide a countermeasure that depends on the history of the operation of the power supply.

Specifically, the countermeasure can depend on information about an event that is made available to a control unit of the power supply. The information can include, for example, information about temporal features such as the point in time at which the event occurred, the temporal distance to a previous countermeasure, and the temporal development of a monitored parameter. The information can also include information about the nature of the event (parameter development indicating a spark, countermeasure in response to a monitored hard arc or soft arc, countermeasure that is initiated based on a temporal distance to a previous countermeasure). Thus, one can use information about the history of detected sparks and previously performed countermeasures to adapt the current countermeasure to the actual situation.

Moreover, in response to features of the history, the operation can be adapted to provide a series of countermeasures. For example, the series of countermeasures can be initiated in response to an arc and/or in anticipation of further arcs. An anticipated pulse can coincide within some time range with a subsequent arc.

When operating a power supply, temporal features of countermeasures can be controlled based on various variables. For example, the countermeasure, in particular, its duration and the temporal distance between countermeasures, and/or the type of countermeasure can be controlled.

Figure 1:
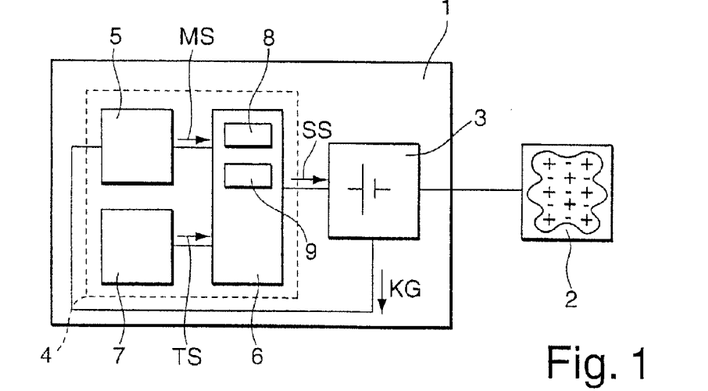
FIG. 1 is a schematic block diagram of a power supply device for a plasma process with an arc discharge detection device.

FIG. 1 is a schematic block diagram of a power supply device 1 for a plasma process 2, where the power supply device 1 is controlled, for example, with an internal arc discharge detection device 4. The power supply device 1 includes a DC voltage source 3 for supplying a DC voltage to the plasma process 2 and the arc discharge detection device 4. The arc discharge detection device 4 is functionally connected with the DC voltage source 3 through signal connections. The arc discharge detection device 4 includes a monitoring unit 5, a control unit 6, and a timer unit 7. The control unit 6 includes a memory 8 and a computing unit 9. The monitoring unit 5 is connected with the DC voltage source 3 through a signal connection. The monitoring unit 5 and the timer unit 7 are each connected with the DC control unit 6 through a signal connection, respectively. The control unit 6 is connected with the DC voltage source 3 through another signal connection.

For the detection of arc discharges in the plasma process 2, the monitoring unit 5 is configured to monitor at least one parameter KG of the plasma DC voltage supply, e.g., of the DC voltage source 3. The parameter KG can be, for example, a voltage or a current of the DC voltage source 3. The parameter can also result from a measurement of a power parameter. For high-frequency (HF) plasma power supplies, for example, the measurement can provide a forward power PI and/or a reverse power PR. One can further use an external parameter for detecting arc discharges.

A decrease in voltage or a dip in conjunction with a correspondingly increased current flow can be caused by the occurrence of an arc discharge in the plasma process 2. The monitoring unit 5 can measure effects of an arc discharge through monitoring the parameter KG, or a corresponding parameter signal. The monitoring unit 5 is furthermore designed to output a corresponding monitoring signal MS to the control unit 6. By outputting the monitoring signal MS, the monitoring unit 5 signals the control until 6 that the monitoring unit 5 has detected the presence of an arc discharge in the plasma process 2 when monitoring the parameter KG.

The control unit 6 is configured to receive the monitoring signal MS from the monitoring unit 5. As is described below, the control unit 6 is configured to generate control signals SS in response to the monitoring signal MS and further signals received, and to output those control signals to the DC voltage source 3, for control of the latter in the suppression or extinction of arc discharges in the plasma process 2. In particular, an interruption or reversal of polarity of the supplied plasma DC voltage, by e.g. DC voltage source 3, can be initiated through the control signals SS.

Herein, the above-mentioned examples of pulse shaped interruptions of the supplied power for the suppression of an arc discharge are also called "countermeasures."

The timer unit 7 of the arc discharge detection device 4 is configured to supply a time reference signal TS to the control unit 6. Through the interaction of both the monitoring unit 5 and the timer unit 7 with the control unit 6, one can identify and assign a point in time of the generation and/or a point in time of the output of an monitoring signal to monitor signals generated by the monitoring unit 5 and outputted to the control unit 6, such as the monitoring signal MS. In other words: through the interaction of both the monitoring unit 5 and the timer unit 7 with the control unit 6, in particular, by receiving both the monitoring signals MS and the time reference signals TS, the control unit 6 can detect the moment of generation and/or output of a particular monitoring signal. Furthermore, using the time reference signal TS, the control unit 6 can detect and/or determine those points in time at which it generates and/or outputs the control signals SS itself. The corresponding information, in particular, temporal information from the timer unit 7, is stored in the memory 8 of the control unit 6 and can be used by computing unit 9 as described below.

For example, the power supply device 1 and the arc discharge detection device 4 of the above described embodiment can be configured to perform a method to operate a plasma process as described in detail below in connection with FIGS. 2 to 5.

Figure 2:
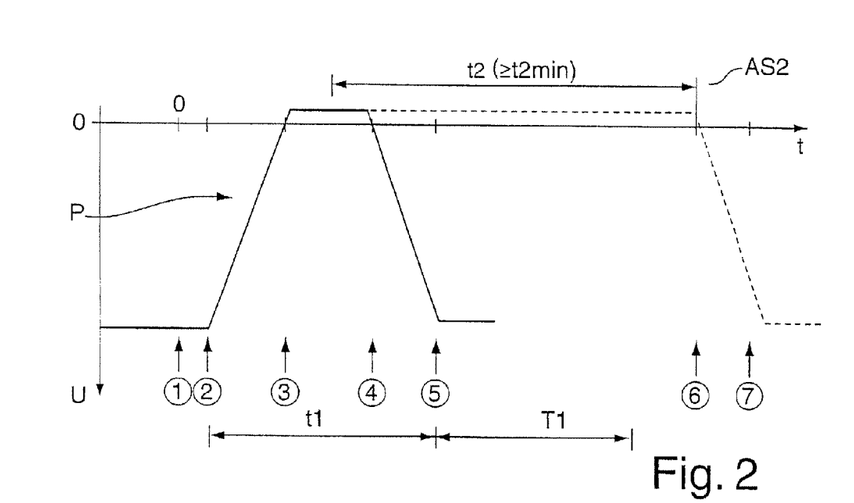
FIG. 2 is a time sequence diagram of a countermeasure, in particular, of an arc discharge extinction cycle.

In FIG. 2, a time sequence diagram illustrates in a schematic form an exemplary arc discharge extinction cycle, as an example for a countermeasure. In particular, FIG. 2 illustrates the temporal behavior of a voltage pulse P during the interruption of the supplied power and, as appropriate, during the reversal of polarity of an output voltage of the DC voltage source 3 in order to extinguish in this manner an arc discharge detected in the plasma process 2. At the point in time ①, for example, at time t=0, an arc discharge is detected in the plasma process 2, as for example, described in connection with FIG. 1.

Thereupon at a point in time ①, the countermeasure in form of an extinction pulse P is initiated. Herein, the point in time ② is referred to as time of introduction, which can be, for example, at time t=0.05 µs, i.e., several nanoseconds. At the time of introduction, the control unit 6 transmits appropriate control signals SS to DC voltage source 3. The control signals SS are based on the monitoring signal MS, which indicates the presence of an arc discharge in the plasma process and is received at point in time ① or shortly thereafter from monitoring unit 5.

Then the power supply is interrupted and according to the temporal behavior of FIG. 2, at a point in time ③, for example at t=0.7 µs, a reversal of polarity of the output voltage U of DC voltage source 3 takes place (U>0).

During the countermeasure, the parameter KG (e.g., the current and/or voltage characteristics of the plasma process 2 and/or DC voltage source 3) is sampled at a high rate by the monitoring unit 5 and compared with a given criterion. The increased sampling rate can begin, for example, at the detection of the arc discharge (point in time ①), at a variable period of time prior to the relevant time of introduction (point in time ②), or at the time of introduction. The criterion can be an underachievement or an overachievement of a threshold value, which can be fixed or variable. For example, the threshold can be modeled over a given time interval according to an average value or peak value of the monitored parameter KG. The criterion can also consider a dynamic parameter behavior, for example, a measurement of the rate of alteration of voltage dV/dt, current dI/dt, or power dP/dt. The frequency spectrum of a parameter can also be used as a criterion. A combination of a plurality of criteria is feasible as well.

If, based on the criterion, a non self-extinguishing arc discharge (hard arc) is detected by the monitoring unit 5, the pulse P. e.g., the reversed voltage, is extended. Thus, for a detected hard arc, an extended extinction time interval t2 can be applied with the countermeasure; for example, the pulse P can be continued at a level reached at the point in time ③ up the point in time AS2 (as shown by the dashed line in FIG. 2). For the extended extinction time interval t2, one can define a minimum duration or a minimum value t2 min of, for example, 20 µs, beginning at the time of detection of the hard arc. In FIG. 2, such a hard arc is detected at a particular time between the points in time ③ and ④ so that the extended extinction time t2≧t2min is applied for the countermeasure as illustrated in the diagram with a dashed line. The extended extinction time t2 extends up to a point in time ⑥, at which the power supply is reactivated, so that at a point in time ⑦ the countermeasure, e.g., the interruption of the supplied power to the plasma process, ends, as does the pulse P.

A short arc as a rule is less strongly pronounced than a hard arc and in particular is self-extinguishing. If such a short arc is detected based on the current or extinction voltage characteristics sampled at a high rate, the power supply, in particular the power supplied to the plasma process, is reactivated at a (non-extended) point in time ④, for example, at a time t=2.7 µs, and the pulse P ends at ⑤, for example, at time t1=3.5 µs. Thus the total duration t1 of the pulse in the case of a short arc is about t1=3.5 µs according to the example of FIG. 2. In general, the duration t1 of such a countermeasure for a short pulse, e.g., pulse, should typically not exceed a time period of 1 to 5 µs, since otherwise the throughput of the plasma process, for example a deposition rate, would be too severely impaired.

As stated above, a short arc can be distinguished from a hard arc (and vice versa) by monitoring the behavior of a parameter during the extinction process. In the event of a presence of a hard arc, the duration of the interruption or reversal of polarity of the power supply is appropriately extended, in order to ensure extinguishing of the hard arc. In this manner it can be achieved that all types of arc discharges are extinguished with an as small as possible arc energy and with an as short as possible interruption of the power supply.

When arc discharges occur frequently, a pulse shaped interruptions can develop, which have no fixed frequency but occur almost regular. The accordingly initiated short countermeasure at each detected arc discharge (in particular at a short arc) have pulse durations ≦1-5 µs, and can achieve that the generation of further arc discharges is delayed. Accordingly, any frequently occurring arc discharges and the corresponding impairment of the throughput can be counteracted.

In some embodiments, a time that has elapsed since the occurrence of previous arc discharges is considered for counteracting a subsequent arc discharge. For example, if an arc discharge is newly detected within a time period T1 of, for example, 5 µs after the end of a preceding pulse P. e.g. after the point in time ⑤ or ⑦, then one increases the extended extinction time t2 by a certain value or a certain extension interval [Δt2+]. The extension interval Δt2+ can in particular also be 5 µs. The new value for a succeeding extended extinction time t2'=t2+[Δt2+] can become effective in the event of detection of the next hard arc and can then be used when counteracting the next detected arc, as described above.

After each extinguished hard arc, e.g. subsequent to a point in time ⑦ in FIG. 2, the second extinction time can be reduced by a given value or a shortening interval [Δt2−] down to the already mentioned pre-set initial or minimum value t2 min. For the exemplary embodiment of FIG. 2, the minimum value t2 min is assigned to be t2 min=20 μs.

In other words: detecting a new arc discharge within the period of time t1 after termination of the pulse P is considered to be indicating that the extinction parameters used thus far do not yet suppress the generation of hard arc discharges in the plasma process with sufficient efficiency. Accordingly, extinction time t2 can be increased further, in order to counteract the generation of arc discharges more sufficiently. However, whenever an arc discharge that has occurred has been successfully extinguished, a reduction of the corresponding extinction time takes place. The reduction of the extinction time preferably can be applied more slowly than its increase. While the extension interval (as mentioned) can be, for example, 5 μs, the reduction of extinction time t2 can take place in steps of, e.g., only 1 μs down to the preset minimum value. These features are also presented in FIG. 3.

Figure 3:
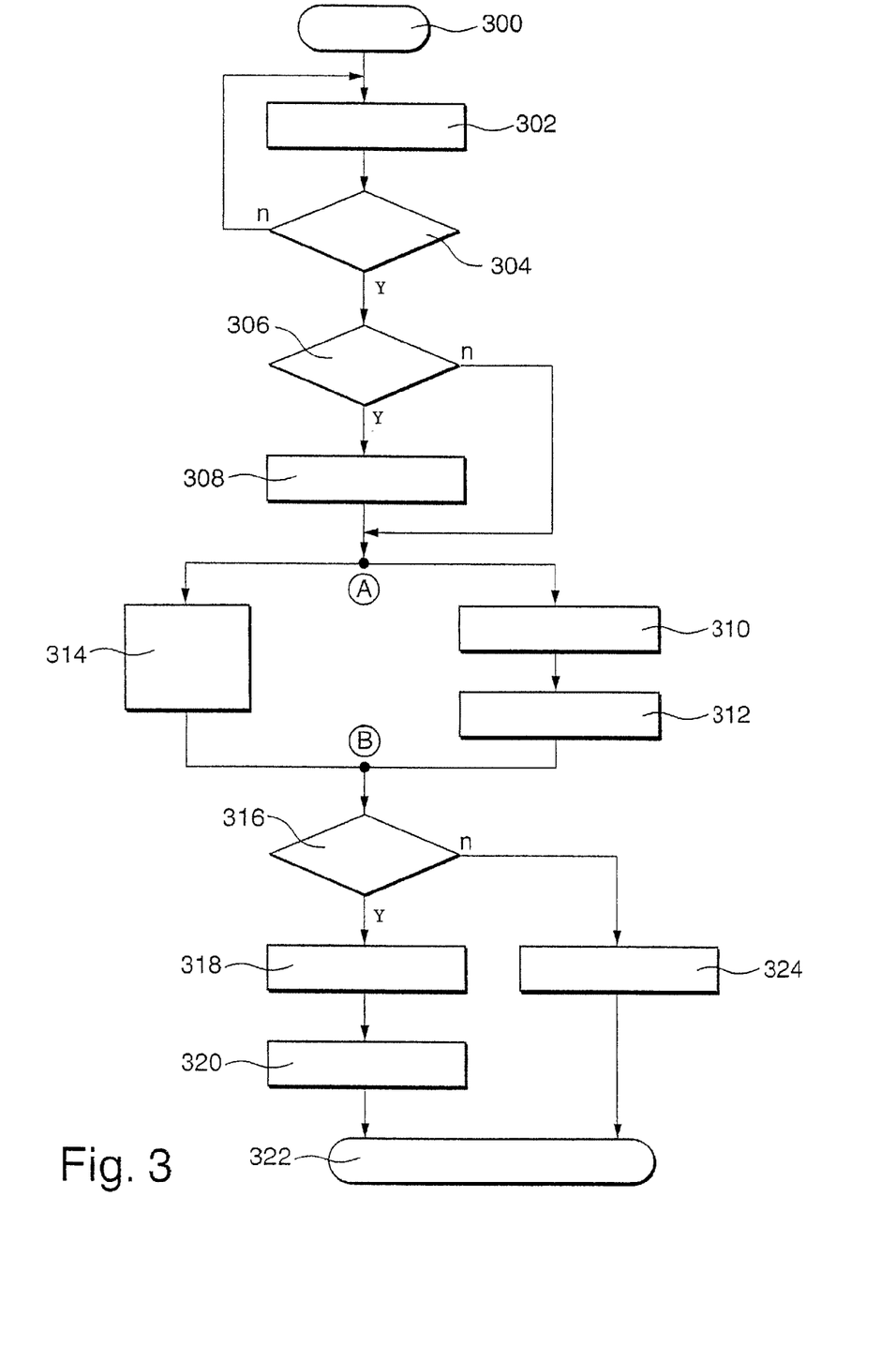
FIG. 3 is a first flow chart of a procedure illustrating operating a power supply device.

In FIG. 3, a flow chart illustrates an operation of, for example, the power supply device 1 for the plasma process 2. The flowchart includes aspects of monitoring a plasma process, increasing extinction pulse durations for a potentially following hard arc, intensified monitoring while initiating and during applying a countermeasure, and extending the countermeasure for hard arcs. In FIG. 3, the countermeasure is based on the monitoring of a parameter indicative for an arc.

The flow chart begins at rounded rectangle 300. In a subsequent step 302, a monitoring of at least one electrical parameter of, for example, the plasma DC voltage source 3 takes place, as, for example, discussed above in connection with FIGS. 1 and 2. Next a check is made in step 304 as to whether an arc discharge has been detected by the monitoring. If this is the case (y), the method is pursued in step 306. Otherwise, is this not the case (n), the method returns to step 302.

In step 306, it is checked whether the arc discharge detected in step 304 lies within a given time interval ever since the previous arc discharge suppression pulse has been terminated, as, for example, is described above in connection with FIG. 2. If this is not the case (n), the method is directly continued at point A of the flow chart. In the affirmative case (y), the extinction time for detected hard arcs is increased in step 308 by an extension interval, as, e.g., described above. Thereafter, the method is continued at point A of the flow chart.

Starting from point A, the flow chart splits into two parallel branches, which can be performed essentially at the same time. In the right branch of FIG. 3, an arc discharge extinction pulse is initiated in step 310 and then the power supply to the plasma process is interrupted (step 312). In the left branch, in step 314, essentially in parallel to steps 310 and 312, a more intensive monitoring of, for example, the current and voltage characteristics is initiated at a very high sampling rate, as already described, for example, in connection with FIG. 2. The sampled current and/or voltage characteristics can be compared with given criteria, to allow differentiating between short arcs and hard arcs in a later step 316. Subsequent to steps 310 and 312, or 314, the two branches are combined at a point B of the flow chart.

In step 316, it is checked whether a hard arc has been detected based on the current or voltage characteristics sampled at a high rate. In the case of a detected hard arc (y), an extended extinction period of time is applied in step 318, as described, e.g., in connection with FIG. 2. Subsequently in step 320 after extinction of the hard arc, the extended extinction time is decreased by the value of a reduction interval, for example by 1 μs, if the preset initial value has not yet been reached. The flowchart ends as indicated by the rounded rectangle 322.

If in step 316 no hard arc has been detected but only a short arc (n), a process represented by step 324 only takes place during a shorter first extinction period of time (e.g. total duration t1 of FIG. 2). The flowchart ends as indicated by the rounded rectangle 322.

In some embodiments, at least one additional countermeasure can be performed during a short period of time after conclusion of a predefined period of time following the termination of an arc discharge extinction pulse in anticipation of potentially succeeding arcs. Such so-called anticipating pulses may coincide with succeeding sparks but do not necessarily depend on those sparks. The time period after termination of a pulse up to the triggering of the next pulse, for example, during a sequence of countermeasures, is not defined in a fixed manner, but rather the time period is determined based on the history, e.g, as a function of the temporal development of parameters or of previous countermeasures. Parameters defining the temporal development can include, for example, the output current and the output voltage at DC voltage source 3 as well as the point in time of at least one previous arc discharge extinction pulse. For example, an appropriate new computation of the time of introduction can be made after each pulse by the computing unit 9 of the control unit 6 of the power supply shown in FIG. 1.

Figure 4:
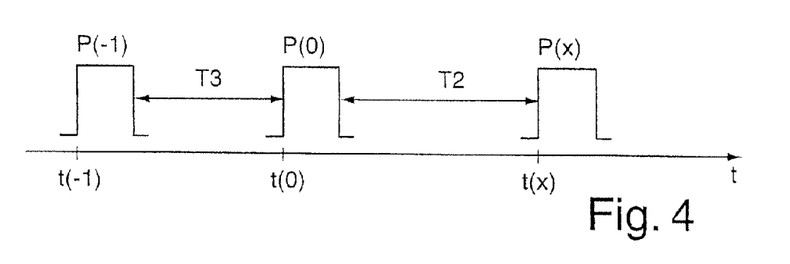
FIG. 4 is a diagram illustrating a sequence of countermeasures.

In connection with FIG. 4, a time sequence diagram illustrates an arc discharge extinction pulse sequence that is schematically represented by the pulses P(−1), at P(0), and P(x). Here P(−1) denotes a previous pulse, P(0) a current pulse, and P(x) a subsequent pulse. The markings at the time points t(−1), t(0), and t(x) on the time axis t indicate the respective initial point in time or time of introduction of the pulses P(−1), P(0), and P(x), respectively, i.e. of the countermeasures thereby effected.

Between the termination of pulse P(−1) and the time of introduction t(0) of pulse P(0) lies a preceding time period T3, while a second time period T2 lies between the termination of pulse P(0) and the time of introduction t(x) of pulse P(x). At the end of the second time period T2, a pulse, i.e. the subsequent pulse P(x), is triggered, wherein a length of the time period T2, which starts at a current pulse P(0), is newly computed for each new subsequent pulse P(x). In particular, the computation of the length of the second time period T2 is based, e.g., on the time interval between the current pulse P(0) and the previous pulse P(−1), i.e. on the value for the length of the preceding time period T3.

For example, the point in time t(x) for the triggering of the subsequent pulse P(x) can be determined with the following equation:

$$t(x)=[t(0)-t(-1)]\cdot k+t(0),$$

wherein t(x) denotes the time of introduction of the subsequent pulse P(x), i.e. of the next suppression, t(−1) denotes the time of introduction of the previous pulse P(−1), t(0) denotes the time of introduction of the current pulse P(0) and k denotes an extension coefficient or numerical factor, which controls the extension or shortening of time period T2 relative to preceding time period T3.

If a preceding pulse, e.g. P(−1) or P(0), was caused by an actually detected arc discharge, a factor k1 can be selected for k, which typically is smaller than 1, k1<1. The factor k1 typically lies in the range between 0.5 and 1. Then, the subsequent pulse P(x) is initiated closer in time to the current pulse P(0), i.e. T2<T3.

If a preceding pulse, e.g. P(−1) or P(0), was triggered in view of an anticipated arc discharge, and, e.g., not due to the fact that any such discharge was detected by monitoring the electrical parameter, but rather because it was anticipated by the herein described method, a factor k2 is chosen, which typically is greater than 1, k2>1. Then, the time interval between pulses P(x) and P(0) increases, i.e. T2>T3.

To explain the above concept with a simple numerical example, the current point in time is set as t=0 μs. A previous pulse P(−1) was initiated at a time t(−1)=−25 μs. The current pulse P(0), which still can be active, was initiated at a time t(0)=−1 μs. Based on a shortening factor k=k1=0.5, the time of introduction of the subsequent pulse P(x) will be at t(x)= (−1 μs−(−25 μs))·0.5+−1 μs=11 μs, i.e., after 12 μs from the time of introduction of the current pulse P(0). Thus, a new pulse P(x) will be triggered after a shorter time interval than the previous time interval, which was |t(−1)−t(0)|=24 μs. Thus, the pulse interval decreases.

Limiting values can be established for the temporal separation and/or the number of pulses within a certain time intervals. For example, for the protection of power switches in the power supply device 1 a limiting value may be defined that ensures that the pulses do not occur more often than the load capacity of the power switches permits. Another lower limit can be established for a particular plasma process that requires a minimum number of pulse repetitions. This can be the case when a series of countermeasures at a low "frequency" is advantageous for the achievement of specific coating properties in plasma deposition processes.

Figure 5:
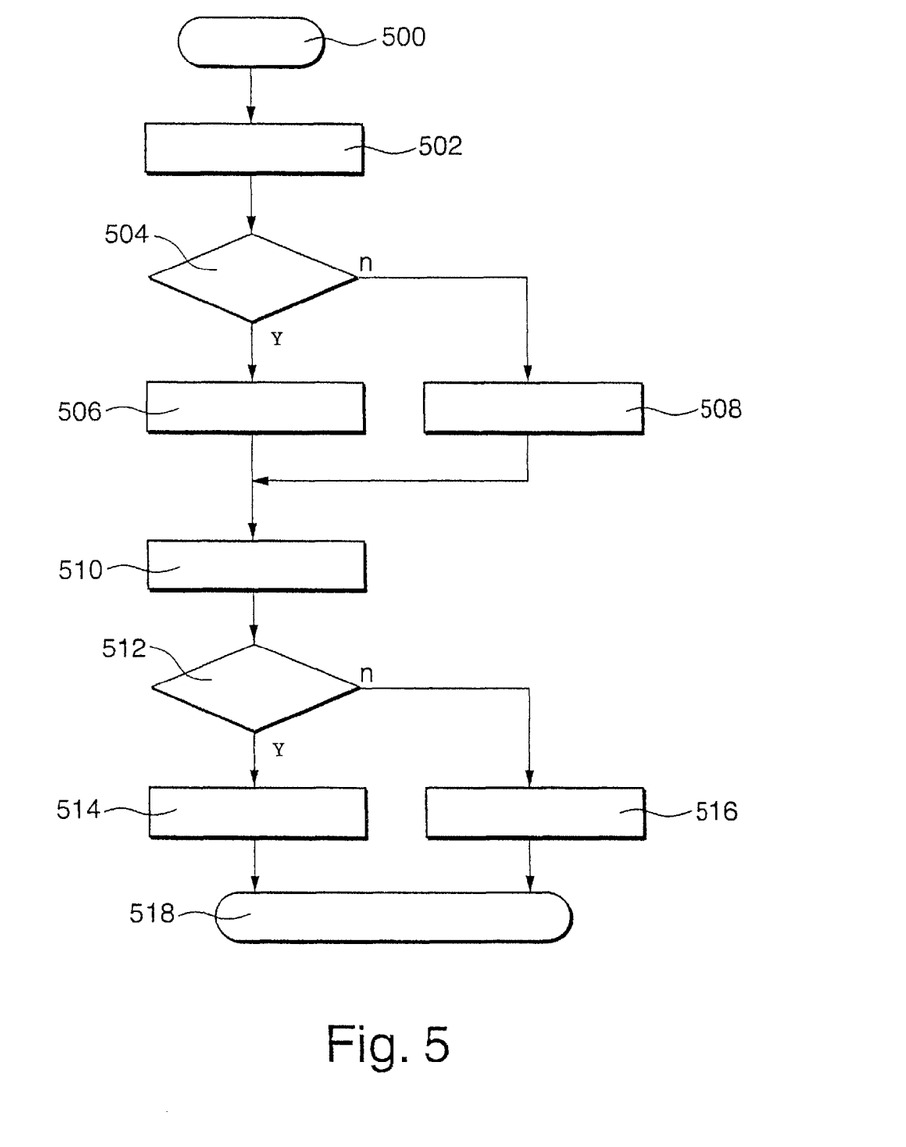
FIG. 5 is a second flow chart of a procedure illustrating operating a power supply device.

The above features are also illustrated in FIG. 5.

In FIG. 5, a flow diagram illustrates the determination of the time of introduction t(x) for initiating a succeeding pulse within a pulse sequence. The determination takes for example into consideration whether the succeeding pulse follows a pulse that has been initiated by an arc, whether the succeeding pulse follows an anticipated pulse, or whether before the succeeding pulse another spark is occurring. The illustrated operation begins at rounded rectangle 500. The steps of the flowchart can be, for example, performed for the most part in computing unit 9 of control unit 6.

In step 502, the time of introduction, e.g. t(−1), of a previous pulse is determined, for example, by reading associated values from memory 8 of control unit 6. In step 504 it is checked whether the pertinent pulse, e.g. P(−1), is a pulse triggered by an arc discharge or is an anticipated pulse. The check can be achieved, for example, by evaluating associated information that has been stored in the memory 8.

If the preceding pulse, e.g. P(−1), has been triggered by an actually detected arc discharge (y), and thus, for example, is associated with a corresponding signal status of the monitoring signal MS (e.g. MS=1), factor k=k1 is chosen in step 506. For the case of an anticipated pulse as preceding pulse, factor k=k2 is chosen in step 508.

In either case, a subsequently computation of the time of introduction of the next pulse, e.g. t(x) for P(x), is performed in step 510 according to a specified formula, in which the value of step 506 or 508 is used. Next it is checked in step 512, if necessary until the calculated subsequent time of induction t(x) has been reached, whether an arc discharge has been detected during the operation of the plasma process. If this is the case (y), a countermeasure is performed as, for example, described above in connection with the flowchart of FIG. 3. If this is not the case (n), the subsequent pulse, e.g. P(x), is generated in step 516 based on the computed time of introduction, e.g. t(x). In either case, the method ends at rounded rectangle 518.

Although the description of the advantages and embodiment above is directed to applications in DC voltage supply systems of plasma processes, it should be noted that the presented approach, is also applicable to bipolar pulsed medium frequency and high frequency (HF) plasma power supply systems.

A number of embodiments of the invention have been described. Nevertheless, it will be understood that various modifications may be made without departing from the spirit and scope of the invention. Accordingly, other embodiments are within the scope of the following claims.

What is claimed is:

1. A method for suppressing arc discharges in an operation of a plasma process, the method comprising:
    monitoring of at least one parameter of the plasma process;
    determining a temporal feature of a first countermeasure as a function of at least one of the following parameters:
        an interval in time from at least one previous countermeasure;
        a development of the at least one parameter since a relevant time of introduction of the countermeasure, or since a variable period of time ahead of the relevant time of introduction of the countermeasure; and
        a differentiation as to whether a previous countermeasure was triggered based on the behavior of the at least one parameter, or based on the interval in time from at least one previous countermeasure;
    performing the first countermeasure;
    determining a second period of time based on the equation t(x)=[t(0)−t(−1)]·k, wherein t(x) denotes a time of introduction of the subsequent countermeasure, t(0) denotes a time of introduction of the first countermeasure, t(−1) denotes a time of introduction of the previous countermeasure, and k denotes a numerical factor; and
    performing a subsequent countermeasure after elapse of the second period of time from the termination of the first countermeasure.

2. The method of claim 1, wherein performing the first countermeasure includes at least one of interrupting a power supply to the plasma process and reversing a polarity of the power supply.

3. The method of claim 1, wherein the temporal feature includes at least one of a time of introduction of the first countermeasure and a first time interval corresponding to the duration of the first countermeasure.

4. The method of claim 1, further including detecting a first arc discharge, and wherein the first countermeasure is triggered immediately after detecting the first arc discharge.

5. The method of claim 1, wherein the first countermeasure is triggered within a few 100 nanoseconds after detecting the first arc discharge.

6. The method of claim 1, further including detecting a short arc discharge, and wherein the first countermeasure is executed during a first time interval.

7. The method of claim 6, wherein the first time interval has a duration of 1 to 5 μs.

8. The method of claim 1, further including evaluating the temporal development of the electrical parameter to indicate a non self-extinguishing arc discharge, and extending a duration of the first countermeasure.

9. The method of claim 8, wherein extending the duration of the first countermeasure includes activating a second time interval.

10. The method of claim 1, further including detecting a second arc discharge within a first prescribed period of time after termination of the first countermeasure, and extending a duration of a second time interval by an extension interval.

11. The method of claim 1, further including detecting no further arc discharge within a first prescribed period of time after termination of a countermeasure, and shortening a duration of a second time interval by a reduction interval.

12. The method of claim 11, wherein the shortening is limited by a minimum value allowed for the second time interval.

13. The method of claim 1, further including determining that the previous countermeasure has been triggered on the basis of detection of an arc discharge, and selecting the numerical factor k according to $k=k1, 0.5 \leq k1 \leq 1$ to shorten the time interval to a succeeding countermeasure.

14. The method of claim 1, further including determining that the previous countermeasure has been triggered independently of any detection of an arc discharge after elapse of a second period of time, and selecting the numerical factor k according to $k=k2, k2>1$ to lengthen the time interval to a succeeding countermeasure.

15. The method of claim 1, further including selecting time intervals between countermeasures within a series of countermeasures to be larger than a minimum time interval.

16. The method of claim 1, further including selecting time intervals between countermeasures within a series of countermeasures to be smaller than a maximum time interval.

17. A method for adjusting the time period between pulses within a sequence of countermeasures for suppressing arc discharges in a plasma process, the method comprising:
    performing the first countermeasure;
    determining a period of time until performing a subsequent countermeasure;
    monitoring of at least one parameter of the plasma process;
    performing the subsequent countermeasure after elapse of the period of time from the termination of the first countermeasure, wherein the period of time is determined based on the equation $t(x)=[t(0)-t(-1)] \cdot k$, wherein $t(x)$ denotes a time of introduction of the subsequent countermeasure, $t(0)$ denotes a time of introduction of the first countermeasure, $t(-1)$ denotes a time of introduction of a previous countermeasure, and k denotes a numerical factor.

18. The method of claim 17, further including determining that the previous countermeasure has been triggered on the basis of the detection of an arc discharge, and selecting the numerical factor k according to $k=k1, 0.5 \leq k1 \leq 1$ to shorten the time interval to a succeeding countermeasure.

19. The method of claim 17, further including determining that the previous countermeasure has been triggered independently of any detection of an arc discharge after elapse of a second period of time, and selecting the numerical factor k according to $k=k2, k2>1$ to lengthen the time interval to a succeeding countermeasure.

20. The method of claim 17, further including selecting time intervals between countermeasures within a series of countermeasures to be larger than a minimum time interval.

21. The method of claim 17, further including selecting time intervals between countermeasures within a series of countermeasures to be smaller than a maximum time interval.

22. The method of claim 17, further including determining that the previous countermeasure has been triggered on the basis of the detection of an arc discharge, and shortening the time interval to a succeeding countermeasure.

23. The method of claim 17, further including determining that the previous countermeasure has been triggered independently of any detection of an arc discharge after elapse of a second period of time, and lengthening the time interval to a succeeding countermeasure.

\* \* \* \* \*

UNITED STATES PATENT AND TRADEMARK OFFICE
CERTIFICATE OF CORRECTION

PATENT NO. : 7,929,261 B2
APPLICATION NO. : 12/044338
DATED : April 19, 2011
INVENTOR(S) : Peter Wiedemuth Page 1 of 1

It is certified that error appears in the above-identified patent and that said Letters Patent is hereby corrected as shown below:

Col. 13, line 15, delete "$k=k1, 0.5 \leqq k1 \leqq 1$" and insert --$k = k1, 0.5 \leq k1 \leq 1$--.

Col. 14, line 13, delete "$k=k1, 0.5 \leqq k1 \leqq 1$" and insert --$k = k1, 0.5 \leq k1 \leq 1$--.

Signed and Sealed this
Fifth Day of July, 2011

David J. Kappos
*Director of the United States Patent and Trademark Office*